(12) United States Patent
Pandya et al.

(10) Patent No.: US 6,792,502 B1
(45) Date of Patent: Sep. 14, 2004

(54) MICROPROCESSOR HAVING A CONTENT ADDRESSABLE MEMORY (CAM) DEVICE AS A FUNCTIONAL UNIT THEREIN AND METHOD OF OPERATION

(75) Inventors: Mihir A. Pandya, Austin, TX (US); Gary L. Whisenhunt, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 244 days.

(21) Appl. No.: 09/689,028

(22) Filed: Oct. 12, 2000

(51) Int. Cl.⁷ ............................................. G06F 12/00
(52) U.S. Cl. .................. 711/108; 711/202; 370/238.01; 370/395.1; 370/395.7; 370/395.51; 370/395.52; 370/395.53; 370/395.71; 709/230; 709/236; 365/49
(58) Field of Search ................................. 711/108, 202; 709/216–217, 219, 245, 239, 240, 230, 236; 370/238.01, 395.7–395.71, 395.64, 395.52, 395.51–395.53

(56) References Cited

U.S. PATENT DOCUMENTS

| | | | |
|---|---|---|---|
| 5,440,715 A | 8/1995 | Wyland | 395/435 |
| 5,684,954 A * | 11/1997 | Kaiserswerth et al. | 709/236 |
| 5,930,359 A | 7/1999 | Kempke | |
| 5,978,246 A | 11/1999 | Shindo | 365/49 |
| 5,983,332 A * | 11/1999 | Watkins | 711/202 |
| 6,026,467 A * | 2/2000 | Petty | 711/108 |
| 6,097,725 A | 8/2000 | Glaise | |
| 6,137,707 A * | 10/2000 | Srinivasan et al. | 365/49 |
| 6,181,698 B1 | 1/2001 | Hariguchi | |
| 6,199,140 B1 * | 3/2001 | Srinivasan et al. | 711/108 |
| 6,236,585 B1 * | 5/2001 | Hill | 365/49 |
| 6,237,061 B1 | 5/2001 | Srinivasan | |
| 6,252,789 B1 * | 6/2001 | Pereira et al. | 365/49 |
| 6,324,087 B1 * | 11/2001 | Pereira | 365/49 |
| 6,374,325 B1 * | 4/2002 | Simpson et al. | 711/108 |
| 6,374,326 B1 * | 4/2002 | Kansal et al. | 711/108 |
| 6,415,354 B1 * | 7/2002 | Joffe et al. | 711/108 |
| 6,493,791 B1 | 12/2002 | Akkary | |
| 6,526,474 B1 * | 2/2003 | Ross | 711/108 |

* cited by examiner

*Primary Examiner*—Matthew Kim
*Assistant Examiner*—Zhuo H. Li

(57) ABSTRACT

A microprocessor architecture (310) has a plurality of functional units arranged in a parallel manner between one or more source buses (412 and/or 414) and one or more result buses (490). At least one of the functional units within the architecture is a content addressable memory (CAM) functional unit (430) which can be issued CPU instructions via a sequencer (480) much like any other functional unit. The operation of the CAM (430) may be pipelined in one or more stages so that the CAM's throughput may be increased to accommodate the higher clock rates that are likely used within the architecture (310). One embodiment involves pipelining the CAM operation in three stages (510, 520, and 530) in order to sequentially perform data input and precharge operations, followed by match operations, and followed Finally by priority encoding and data output.

39 Claims, 5 Drawing Sheets

| V | S | DT2 | DT1 | DT0 | TAG | MASK |
|---|---|---|---|---|---|---|
| 1 | x | x | x | x | A1 | M1 |
| 1 | x | x | x | x | A2 | M2 |
| 1 | x | x | x | x | A3 | M3 |
| 1 | x | x | x | x | A4 | M4 |
| 1 | x | x | x | x | A5 | M5 |
| 1 | x | x | x | x | A6 | M6 |

*FIG.3*

| V | S | DT2 | DT1 | DT0 | TAG | MASK |
|---|---|---|---|---|---|---|
| 1 | 0 | x | x | x | A1 | M1 |
| 1 | 0 | x | x | x | A1 | M1 |
| 1 | 0 | x | x | x | A1 | M1 |
| 1 | 0 | x | x | x | A2 | M2 |
| 1 | 0 | x | x | x | A3 | M3 |
| 1 | 0 | x | x | x | A3 | M3 |

*FIG.4*

| V | S | DT2 | DT1 | DT0 | TAG | MASK |
|---|---|---|---|---|---|---|
| 1 | 0 | x | x | 1 | MAC1[31:0] | 0xFFFFFFFF |
| 1 | 0 | x | x | 0 | MAC1[47:32] | 0x0000FFFF |
| 1 | 0 | x | x | 1 | MAC2[31:0] | 0xFFFFFFFF |
| 1 | 0 | x | x | 0 | MAC2[47:32] | 0x0000FFFF |
| 1 | 0 | x | x | 1 | MAC3[31:0] | 0xFFFFFFFF |
| 1 | 0 | x | x | 0 | MAC3[47:32] | 0x0000FFFF |

*FIG.5*

| V | S | DT2 | DT1 | DT0 | TAG | MASK |
|---|---|-----|-----|-----|-----|------|
| 1 | 0 | 0 | 1 | 1 | MAC1[31:0] | 0xFFFFFFFF |
| 1 | 0 | 0 | 1 | 0 | MAC1[47:32] | 0x0000FFFF |
| 1 | 0 | 1 | x | x | IP_A1 | IP_M1 |
| 1 | 0 | 1 | x | x | IP_A2 | IP_M2 |
| 1 | 0 | 0 | 1 | 1 | MAC2[31:0] | 0xFFFFFFFF |
| 1 | 0 | 0 | 1 | 0 | MAC2[47:32] | 0x0000FFFF |

US 6,792,502 B1

MICROPROCESSOR HAVING A CONTENT ADDRESSABLE MEMORY (CAM) DEVICE AS A FUNCTIONAL UNIT THEREIN AND METHOD OF OPERATION

RELATED APPLICATION

This is related to Pandya et al., Attorney Docket Number SC10902TH, entitled "A Flexible Content Addressable Memory (CAM) Device and Method of Operation," filed on even date herewith, and incorporated herein by reference

FIELD OF THE INVENTION

The present invention relates generally to microprocessor architectures, and more particularly to, a content addressable memory (CAM) that is routed as a functional unit within the microprocessor architecture.

BACKGROUND OF THE INVENTION

In the integrated circuit (IC) industry and communications industry, content addressable memories (CAMs) are widely used in many different applications. Content addressable memories are commonly used in data routing systems (e.g., such as in switches and routers) to look up addresses of the packets that flow through the switches and to quickly, correlate incoming data addresses to communication channel outputs so that data is quickly routed through telecom systems. This includes MAC address lookup for Ethernet switching, ATM VPI/VCI lookup for ATM switches and IP address lookup in routers. CAMs are also used for classification of packets. CAMs can also find use in other diverse applications such as pattern matching, voice recognition, data compression, branch target address cache or MMUs inside a microprocessor, etc. In these common applications, one of two prior art content addressable memory (CAM) architectures have generally been used.

A first content addressable memory (CAM) architecture is referred to as the binary CAM. The binary CAM stores different N bit tags in many different rows of memory in the CAM. During operation, the CAM is provided with N bit compare values and compares these N bit compare values with the N bit tags in order to determine if there is a match in the CAM. In order for a hit or match to occur in the CAM, every bit in the N bit tag must match an associated bit within the same bit position of the N bit data value. Due to the requirement of an exact match at each and every bit location, industry use of binary CAMs can be limited in many applications. For example, in the communications industry, use of binary CAMs can be problematic for routing in higher layers (e.g., layers 3–7) of the ISO 7-layer reference model. In addition, conventional binary CAMs can only process tag values of the same size (e.g., all are 32 bit) and all rows in the CAM must contain the same type of data. For example, a single conventional binary CAM cannot contain both Ethernet and IPv4 routing data.

A second type of CAM utilized in current telecom systems is referred to as a ternary CAM. IP address lookup typically requires the use of a ternary CAM since certain fields of the addresses are masked. In a ternary CAM, N bit tags that are stored within the CAM may be compared against input values that have been masked by a mask value. The mask value creates "don't care" bits within the compare value so that a hit can occur in the ternary CAM even when only some of the tag bits stored with the ternary CAM match the input compare value. Due to this "don't care" flexibility, ternary CAMs generally have more diverse and numerous application possibilities than binary CAMs, and are more likely to be used in applications pertaining to higher layers (e.g., layers 3–7) of the ISO 7-layer reference model. However all ternary CAMs to date still only store tag data limited to certain predetermined sizes, and these ternary CAMs can only store data of a single data type in a manner similar to the binary CAM.

In current voice and data transmission systems, many different layers of protocol are woven together in order to enable communication from a source to a destination. For example, Ethernet, ATM, FDDI, ISDN, token ring, firewire, TCP/IP, HTTP, TDP, RTI. TELNET, MPLS, wireless, and many other protocols, technology, or standards may be used to transfer information from one location to another location. Each of these different mechanisms or protocols require CAM matching of different sizes of data (e.g., Ethernet has 48 bit addresses, IPv6 has 128 bit addresses, IPv4 has 32 bit addresses, some classification processes use hundreds of bits. etc.). In addition, these different mechanisms or protocols require different types of data that may need to be handled in different manners or uniquely identified in certain applications. Therefore, in the past, separate CAM circuitry had to be provided for each different protocol used within a data and/or voice router. This need for multiple CAMs increased costs reduced speed of processing, and/or adversely increased the IC area of the router solution where printed circuit board footprints increased.

Therefore, a need exists in the industry for a CAM that can process data quantities of different sizes as well as data quantities of different types within the same physical CAM in an efficient and effective manner.

BRIEF DESCRIPTION OF THE DRAWINGS

The present invention may be better understood by referencing the accompanying drawings. The use of the same reference symbols in different drawings indicates similar or identical items.

FIGS. 3–6 illustrate the contents of a CAM according to various embodiments of the present invention.

FIG. 7 illustrates a line card architecture that preferably uses one or more of the CAMs set forth in FIG. 2.

DESCRIPTION OF A PREFERRED EMBODIMENT

Figure 1:
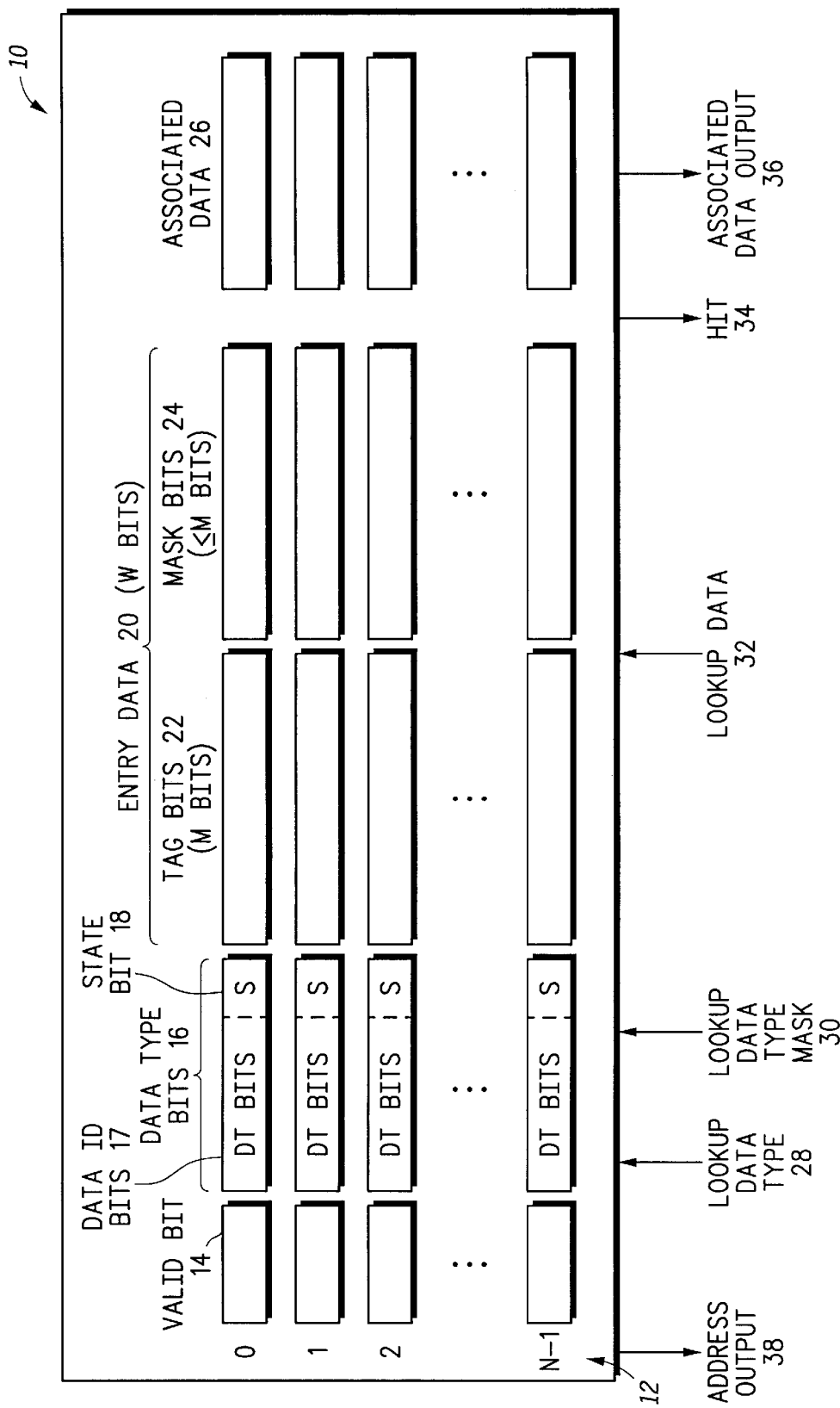
FIG. 1 illustrates a logical representation of a content addressable memory.

A novel content addressable memory (CAM) architecture is disclosed for efficient accessing of data in a data processing system. The novel CAM architecture includes various new data fields within the CAM data row entries and includes some new circuitry for accessing the CAM data. Each data row entry includes a data type field and the data field itself. The data field includes a tag field and a mask field. Each row entry in the CAM includes optional fields such as valid indicator(s) and associated output data fields.

Use of a data type field provides the advantage that data of different types may be handled in a single CAM. For example, a single CAM structure (e.g., in a multiprotocol switch) may process all or a subset of Ethernet, ATM, FDDI, ISDN, token ring, firewire, TCP/IPv4, TCP/IPv6, HTTP, UDP, RTP, TELNET, MPLS, wireless, or other data simultaneously. In a communications system processing information in multiple layers having different data types (e.g., layers 2 and 3 TCP/IP) of the International Organization for Standardization Reference Model of Open System Interconnection (the ISO model), a single CAM can store information from different such layers based on the teachings herein.

Data type fields also provide the advantage of packet classification. Packet classification refers to the process of classifying packets based upon the contents of fields in the packets. These fields are extracted from different protocol layers in the packet. Each unique combination of fields can be referred to as a key. The keys may be searched in a CAM to match an appropriate data type field and corresponding action can be taken as a result of a successful match. Therefore, a CAM's ability to store multiple types of keys (or data types) facilitates implementation of packet classification schemes. Sometimes a combination of hardware (i.e. CAM based) and software techniques are employed for packet classification. Under a method called multidimensional hierarchical search, the keys are broken up into small chunks that are individually searched using a CAM or software data structures (or both) and the results are combined to obtain a match. Thus, CAMs utilizing data type fields can also be applied to such systems.

Data typing provides a further advantage that multiple entries or rows in the CAM may be logically linked together to form arbitrarily large entries so that data of varying lengths may be stored in the same CAM. Thus, a flexible CAM architecture is provided which eliminates the need for multiple CAM circuits to be provided to handle different data types and/or different data sizes.

Embodiments of the present invention also allow for a CAM to be designed as a functional unit within a microprocessor. This allows for the microprocessor to issue instructions to the CAM via a sequencer much like it does to other functional units (e.g. arithmetic logic units, load store units, etc.). Therefore, a functional unit CAM provides the advantage of improved speed and efficiency of the microprocessor. Any CAM may be designed to be used as a functional unit. For example, a CAM such as the one illustrated in FIG. 1 may be used.

FIG. 1 shows a logical representation of a content addressable memory (CAM). CAM 10 includes a number N of CAM entries or rows 12 where N is any integer greater than zero. Each CAM entry or row 12 includes various fields such as one or more valid, data type, entry data and output fields. For example, each CAM entry 12 in FIG. 1 includes one or more valid bits 14, data type bits 16, and entry data bits 20. In the disclosed embodiment, each entry or CAM row 12 further includes one or more associated data fields 26.

CAM 10 is a ternary CAM with data typing capability. To enable data typing capability, each entry or row 12 in the CAM includes data type bits 16 for indicating the data type of each entry 12 of CAM 10. In the embodiment of FIG. 1, data type bits 16 include data ID bits 17 and state (S) bits 18. Data ID bits 17 describe the type of data that is stored in the data section 20 of the corresponding entry 12 (e.g., the tag bits 22 and the mask bits 24). Data ID bits 17 and entry data bits 20 are user programmable.

As an example of the use of the bits 16, a bit value 17 of binary 001 may indicate Ethernet CAM content within one or more CAM rows, while a bit value 17 of binary 101 indicates IPv6 data within one or more rows of the CAM. In another form, the data ID bits 17 may be used to indicate a different kind of "data type" other than the specific protocol used to process the incoming or outgoing data. For example, the data ID bits 17 may indicate, via a first binary value, that the data being sent on that connection belongs to a first entity (e.g., Motorola Inc.) while a different binary data value 17 would indicate that the data flowing through that connection belongs to another entity (e.g. Cisco). In this embodiment, the data type may be used to assign priority, resources, and/or specific security to the data transmission based upon the party originating and/or receiving the data. Therefore, the data type bits 16 may be used for one or many different data typing purposes.

Each entry data field 20 includes tag bits 22 and mask bits 24. The bit width W of each entry or row of the data field 20 is implementation dependent and is generally selected to increase performance for a specific application. For example, a width of W=32 bits (not counting the data type bits 16) allows for each 32-bit or less entry match to be performed in one clock cycle in a data processing system. The width W specifies the physical size of an entry or row in the CAM array. Logical entries in the CAM array are represented by a collection of one or more physical entries that are usually, but not necessarily, sequentially located in the CAM array. In one embodiment, a lookup of a logical entry requires one access per physical entry, whereas other embodiments may perform a parallel access of multiple rows for logical entries. The use of successive accesses of physical entries to access a logical entry is described in greater detail hereinafter with reference to FIG. 2. Therefore, for example, any CAM size in FIG. 1 could simultaneously store and process 48-bit Ethernet addresses, 32-bit IPv4 addresses, 128 bit IPv6 addresses, or other data of different sizes or types in a seamless manner.

During a CAM search operation CAM 10 receives a lookup data item (e.g., lookup data 32) data type information (e.g., lookup data type 28) and optional data type mask information (e.g., lookup data type mask 30). CAM 10 then compares lookup data 32 to all data stored in entries 12 which have data type bits 16 which match lookup data type 28 for values which are qualified by lookup data type mask 30. To obtain a ternary search capability, the tag bits 22 of each entry having the data type indicated by lookup data type 28 and lookup data type mask 30 are compared to the lookup data 32 subject to the mask of mask bits 24. If the lookup data 32 is appropriately matched to the tag data 22 in an entry 12, and if the various mask and data type conditions are satisfied, CAM 10 generates a hit indication (e.g., asserts hit output 34) and generates an output search result such as address information or other associated data 36. If there is a match (i.e., a hit), a hit indication is generated (e.g., hit output 34 is asserted) and the address of the matching entry and/or its associated data type (e.g., data type bits 16) are returned. If the implementation contains associated data 26, then the contents of that field may be returned with the address of the matching entry. If there are multiple matches, priority encoder circuitry (not shown) selects an entry with the highest priority (e.g., one with the smallest or largest address). One or more valid bits 14 are associated with each entry and is implicitly used in each match operation.

Whenever a lookup in CAM 10 is performed for lookup data 32 some bits of the data type bits 16 may be masked. The mask for the data type may be provided with the lookup command as lookup data type mask 30 or may be implied by the specific operation being performed. The mask for the data type can be changed from one lookup operation to another. This distinguishes the data type field 16 from the entry data field 20 which includes a static mask (mask bits 24) stored along with the data (tag bits 22) in each entry 12 of CAM 10.

Although traditional CAM devices allow entries of only a fixed size to be stored in the device, CAM 10 includes state bit (S) 18 to provide for flexible storing of data types having lengths greater than the physical size of the entry data width M of entries 12. State bit 18 ties multiple entries or rows 12 of the CAM together to allow storage of arbitrarily large sizes of data in CAM 10. Whenever a match is detected by the CAM, if an entry number n matches the lookup, then the S bit of the entry (n+1) is set so that the next search operation of CAM 10 will check the next entry for a subsequent data match when the lookup data is too long for a single search cycle. Therefore, a data value that spans three rows of the CAM array may take up to three clock cycles to access wherein the S bit is used to properly cycle the sequential access through the three rows of associated CAM data. As a specific example, if the physical size of tag bit 22 is 32-bits, a 32-bit IPv4 address could be accessed in one clock cycle while a 128-bit IPv6 address would require up to four clock cycles to access when using a sequential access methodology. The operation of state bit 18 is more fully discussed with reference to FIG. 2 hereinafter.

Figure 2:
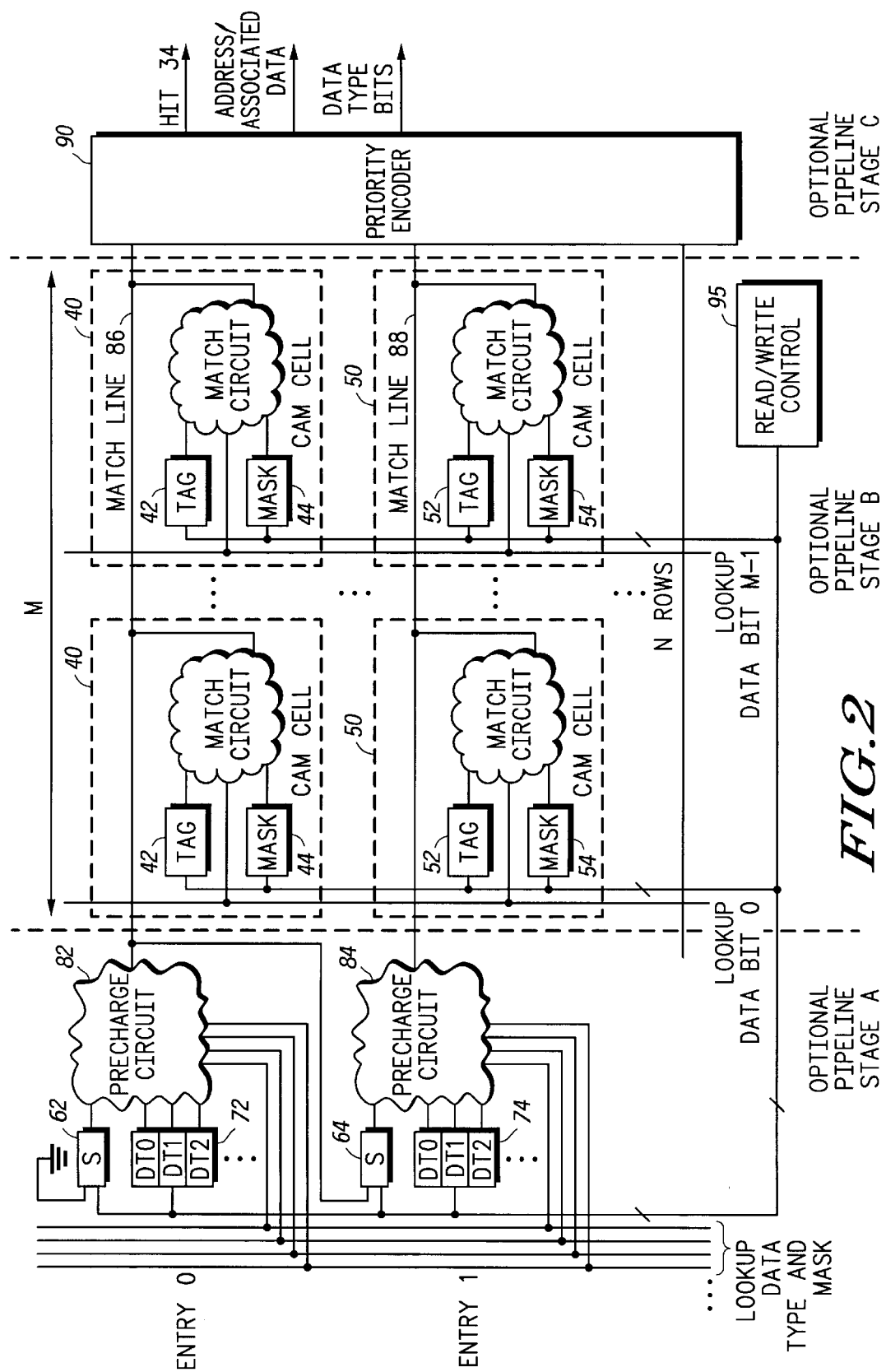
FIG. 2 illustrates one implementation of the content addressable memory of FIG. 1.
Figure 8:
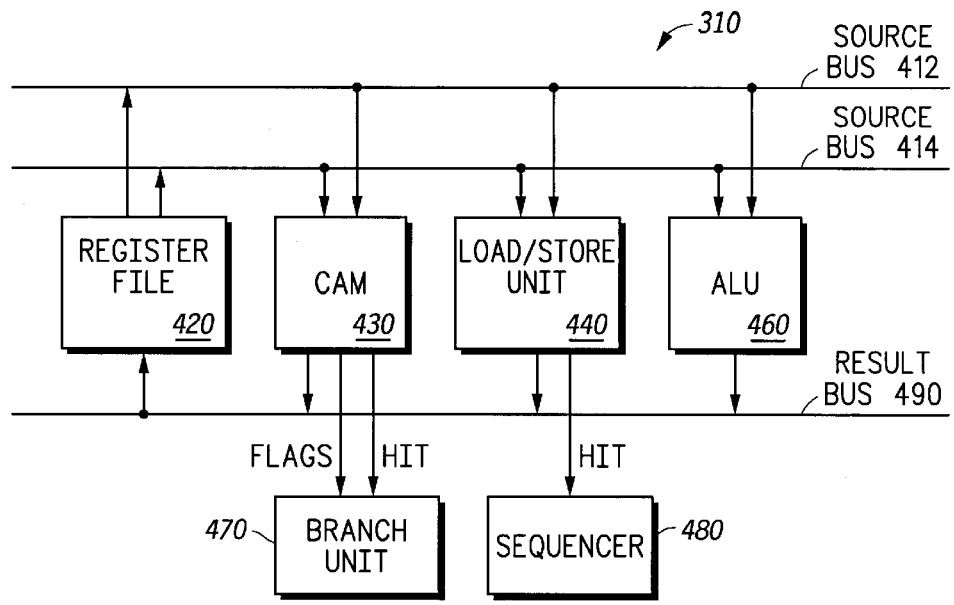
FIG. 8 illustrates a microprocessor architecture that includes a CAM, as generally set forth in FIG. 2, as a functional unit within the architecture.

FIG. 2 shows one implementation of CAM 10. In one form, the CAM need not be pipelined in its operation. In another form, the CAM 10 may be pipelined to allow it to be more efficiently integrated as a functional unit into a higher speed network processor (e.g., operating at 500 MHz–800 MHz or above) as shown in FIG. 8 herein. When pipelined, clock signals and temporary storage units (e.g., D flip-flops) are used to parse the CAM 10 into multiple stages of operation. FIG. 2 illustrates that, in one embodiment, the CAM 10 may be parsed to create a three-stage pipeline CAM (with stages A, B, and C) that can output information on a result bus much faster than most non-pipelined implementations.

Regardless of whether or not the CAM is pipelined, CAM 10 includes precharge circuitry 82 and 84, data type storage circuitry 62, 64, 72, and 74, an array of CAM cells 40 and 50, priority encoder 90, and a CAM read/write controller 95. For example, the precharge circuitry of CAM 10 includes one precharge circuit 82 or 84 for each precharging match line illustrated by match lines 86 and 88. Any of various types of precharge circuitry that are well known in the art may be used without departing from the scope or spirit of the invention as claimed. The data type circuitry includes state bits (S) 62 and 64, and data ID bits (DT#) 72 and 74. Specifically precharge circuit 82 is coupled to receive state bit 62 and data ID bits 72 of entry 0, and precharge circuit 84 is coupled to receive state bit 64 and data ID bits 74 of entry 1. CAM 10 may be used in an SRAM mode, as is common among traditional CAMs to allow various operations to directly read and write entries of CAM 10, for example, using read/write controller 95.

The arrangement of FIG. 2 shows a specific data width for various architectural features. For example, the data type bits 72 and 74 are shown in FIG. 2 as generally having three bits. It is important to note that any number of bits may be used to form the data type bits for each row or entry in the CAM. In addition, the S bits 62 and 64 may be one or more bits.

The CAM cell array is an M-by-N array of ternary CAM cells. The array of ternary CAM cells is N rows deep by M columns wide. M is generally equal to the number of tag bits 22 of entry data field 20. N is generally equal to the number of entries 12 of CAM 10. However, M and N may vary in a dependent or independent manner in other embodiments. Thus, although FIG. 2 shows only four exemplary CAM cells via CAM cells 40 of entry 0 and CAM cells 50 of entry 1, many other such CAM cells are present in the CAM array as indicated by the ellipses in FIG. Generally, M×N arrayed CAM cells are located in the array of FIG. 2.

Each CAM cell 40 or 50 is coupled to receive a corresponding lookup data bit from lookup data 32 (see FIG. 1), a specific tag bit 22, and a specific mask bit 24 all generally associated with the same bit position in the preferred embodiment. Each CAM cell includes a match cell which compares via conventional logic gates an input lookup data bit with corresponding tag and mask bits and provides a match indicator output. For example, a CAM cell 40 compares lookup data bit 0 (e.g., a single bit from lookup data 32 of FIG. 1) with a first tag bit 42 of entry 0 and the first mask bit 44 of entry 0 in the CAM. An asserted match indication is provided on match line 86 to priority encoder 90 if a match occurs in each cell 40 along that row or entry 0 using the tag, match and lookup bits.

Note in one embodiment that all match lines are precharged, and the cells 40 are designed so that one or more bits mismatched along match line 86 discharges the precharged match line. In this case, discharged match lines are unselected while charged match lines are selected. However, both active high or active low encodings of the match lines may be accommodated in other embodiments. In any event, the CAM cells 40 and 50 of FIG. 2 drive one or more match lines towards a value indicating that a match has or has not occurred on that specific row/entry.

When match line 86 is driven to a value which logically indicates a match for entry 0, state bit (S) 64 in some following or logically connected entry/row of the CAM is set to indicate that a match was previously found in a preceding entry during a first search. This setting of the S bit after a first search allows a second search to be performed after the first search in an attempt to find one or more subsequent portions of data that together create a logical data type which is too long to be stored solely in one physical entry of the CAM. Also, to save power, one embodiment may precharge only those lines with the appropriate data type bits 16 set for the subsequent searches.

For example, assume that the physical entry size M is 32 bits in FIG. 2 (e.g., there are 32 bits in each of the tag bits fields 22 in FIG. 1), and that the logical data type being searched for has a 96-bit data length. Further assume that the 96-bit value is broken into three 32-bit values of X, Y, and Z respectively wherein the entire 96-bit value has a binary representation of XYZ. It does not matter if X is most significant or if Z is most significant since either big endian, little endian, or any other format may be employed herein.

In this case, a first search may determine that the first 32-bit value X was found in entry/row 0 (and maybe was also found in other locations such as a CAM entry/row 17 as well). In this case, the S bits of rows 1 and 18 and all other rows subsequent to the "hit" row(s) are set. The next access to the CAM will search the rows with the set S bit (e.g., rows 1 and 18) for the presence of the next 32-bit value Y. If the 32-bit value Y is found in only one of selected rows 1 or 18, then the next row after that row (i.e., row 2 or row 19) has its S bit set. However, if both rows "hit" by finding Y in their location, then both rows 2 and 19 have their S bits set. The next access continues the search on the rows with S bits set in order to attempt to find the last 32-bit value C. If any one of X, Y, or Z is not found in the proper sequence then the search terminates for that chain of rows. If no S bits remain set in the end or if no S bits are found in the middle of the search, the search algorithm may terminate and record a "miss" (e.g., the lack of a hit in the CAM). If any one or more set of sequential or related locations returns XYZ of the same data type, a hit is recorded by the CAM 10. If multiple XYZ hits occur, the priority encoder 90 handles the conflict accordingly. Thus, CAM 10 stores data of arbitrary type and size and enables efficient and effective searches of that different data without conflict.

In some cases, the data type bits 16 of the entry 12 that matches the lookup data 28 are returned as a result of the search to allow programmable control (e.g., loops and branches) dependent upon or corresponding to the access of data stored in CAM 10. As is common, the priority encoder 90 resolves multiple match indications, if any, and provides an appropriate hit output 34. Priority encoder 90 also provides address output 38 and data type bits 16 in one embodiment.

Read/write controller 95 allows a central processing unit (CPU) or like controller to read and/or write certain values to state bits 62 and 64, data ID bits 72 and 74, tags 42 and 52 and mask bits 44 and 54. Any of various types of read/write controller 95 that are well known in the art may be used without departing from the scope or spirit of the invention as claimed.

Because CAM 10 stores data of arbitrary type and size, it is useful to describe its interface through a set of operations. These operations (which look like processor instructions and may be implemented as such) allow the data type, data fields, and/or other information to be specified for the search. The operations described below are of the form of microprocessor instructions, but may be implemented in other manners. The operands for these operations may be obtained from registers, and the results of the operations may be delivered into registers. Alternate embodiments may obtain the operands from memory and return the results to memory. The lookup data type 28 and/or lookup data type mask 30 can be specified as an immediate field of the operand or as an implied field. The data type bits 16 of the matching entry returned from the lookup can be delivered to a condition code register (CCR) upon which conditional branch instructions may operate. In other embodiments, different set of operations might be provided (e.g., for standalone devices).

The following operation performs a search of CAM 10:

ldentry $CF_{imm}$, Rt, Ra (load entry instruction)

The contents from register Ra is masked by the mask bits 24 and compared with the tag bits 22 of each of the valid entries 12 whose data type bits 16 are set as specified by the $CF_{imm}$ immediate field of the instruction. If there is a match, the hit signal 34 is asserted and the address of the corresponding entry is saved into register Rt. If a miss occurs, hit signal 34 is not asserted and the contents of register Rt after the match is indeterminate. The status of hit signal 34 is saved in a control register inside a processor and is used to perform a conditional branch or other change of flow instructions, for example. The data type bits 16 of the matching entry are also saved in the control register and can be used to perform similar change of flow operations. Here we assume that if there are multiple hits, a priority encoder selects the lowest address, for example, among all matching entries.

If the associated data field 26 is implemented, then the contents of the associated data field 26 of the matching entry (or the associated data field 26 of the entry 12 with the lowest address if there are multiple matches) is concatenated to the address of the matching entry and written into register Rt.

Lookup data type mask 30 is implicit in the $CF_{imm}$ field and the contents of the data ID bits 17. A "0" in the $CF_{imm}$ field masks out the corresponding data ID bit. A "1" selects that data ID bit but the match is successful only if the data ID bit is a "1". One example of encoding the $CF_{imm}$ field of the instruction assuming its size is 4 bits and there are 3 condition bits is a one to one correspondence with the data ID bits 17 concatenated with the state bit 18. A "1" in a data type bit implies that that bit is used for the match. If there are multiple "1"'s in a row, it means that the value of all bits that have a "1" in the table are "ANDed". For example, if the value of $CF_{imm}$ is 1011 (corresponding to S, DT2, DT1, and DT0, respectively), then the match line is asserted only if there is a match in the entry and the state bit is set and DT1 and DT0 bits are also set and DT2 is a don't care. The following are some examples of search operations that may be performed on a CAM such as CAM 10.

One example of a CAM (e.g. CAM 10) storing unique IPv4 addresses is illustrated in FIG. 3. In this case, each destination of the route table of FIG. 3 includes a single route, thus making all the entries in the CAM unique. Each route table entry is located in the TAG area and its corresponding mask in the MASK area. The "V" column includes a valid bit for each entry. Therefore, in one embodiment, all the searches described below are performed on valid entries. (Note also, in one embodiment, each entry can be ordered such that the entry with a longer prefix is stored at a lower address so that it can be selected by a priority encoder) Therefore, the following instruction seeks a match on an IPv4 address:

ldentry 0b000, Rt, Ra

In this instruction, the contents of Ra are matched to an entry in the table and the matching address is delivered to Rt. Note that the "0b" in front of the "0000" in the $CF_{imm}$ field indicates the number following it is in binary format. The $CF_{imm}$ value used in this instruction includes implicit masking information. Each of the four bits corresponds to the data type bits, S, DT2, DT1, and DT0, respectively. Since each value of the four bits in $CF_{imm}$ is 0, the data type bits are not taken into consideration for the search.

One example of a CAM storing multiple IPv4 address is illustrated in FIG. 4. In this mode, each destination address may have multiple routes so multiple entries with the same destination address may be stored in the CAM. Therefore, a state bit (S) will be set to indicate that there are additional entries that match the same address, as will be shown below. At the beginning of the search process, the S values are all cleared (as seen in FIG. 4) and the following instructions provides access to all the multiple entries:

ldentry 0b0000, Rt, Ra
branchonclear hit, no__match
/*Do something with Rt */
loop__begin:
   ldentry 0b1000, Rt, Ra
   branchonclear hit, out__of__loop
   /*Do something with Rt*/
   branch loop__begin
out__of__loop: . . .

In the segment above, the first ldentry instruction (in the first line) performs a search on the CAM ignoring all the data type bits S, DT2, DT1, and DT0, as indicated by $CF_{imm}$ being set to "0000." Each time a matching entry is found, the S bit in the entry following the matching entry will be set to 1. Therefore, the "branchonclear" instruction will branch to "no_match" (which can refer to any point in the code, as designed by the user) if no hits are found. However, if a hit is made, then flow continues to the next instruction following the branchonclear instruction. In one embodiment, the user may wish to perform some function or analysis on Rt prior to continuing the search. Alternate embodiments may perform other instructions prior to continuing the search.

The label "loop_begin" is then reached which starts with a second ldentry instruction. This ldentry instruction searches only those entries where the S bit is set, as indicated by $CF_{imm}$ being set to "1000," corresponding to S, DT12, DT1, and DT0, respectively. In this search, data ID bits DT2, DT1, and DT0 are still ignored. The branchonclear within the loop will branch to some point outside the current loop (to a point indicated by the label "out_of_loop") if no hit is made (i.e. if no match is found). If a match is found, then Rt can be processed, and the loop will continue until no more matches are found among those entries with their S bit set. Therefore, this code segment successfully finds all matching entries.

One example of a CAM storing unique MAC (media access control) addresses is illustrated in FIG. 5. Since MAC addresses are 48 bits, each MAC address is stored in two consecutive memory entries as shown in FIG. 5. For example, MAC1 stores its lower order 32 bits (MAC1 [31:0]) in a first entry and its higher order 16 bits (MAC1 [47:32]) in a subsequent entry. In order to differentiate between the two types of entries, the data ID bit DT0 is used. If the entry corresponds to a lower order 32 bit portion of a MAC address, then DT0 is set to 1. Else, if the entry corresponds to a higher order 16 bit portion of a MAC address, DT0 is cleared (i.e. set to 0). The following sequence of instructions can therefore perform a full 48-bit match:

ldentry 0b0001, Rt, Ra ldentry 0b1000, Rt, Rb branchonclear hit, no_match

In the above segment, the first line performs a search for the lower order 32 bits on entries with DT0 equal to 1, as indicated by $CF_{imm}$ being set to "0001". As described above, those entries with DT0 set to 1 indicate that the entry corresponds to the lower order 32 bits of an address. Ra contains the address of the lower order 32 bits of the destination MAC address and Rt receives the matching address if one is found. If any match is found, the S bit of the entry following the matching entry is set to 1. Therefore, the next ldentry instruction performs a search on only those entries whose S bit is set. If a match is found after executing this next ldentry instruction, then a match of the full MAC address has been found in the CAM.

Figures 6, 7:
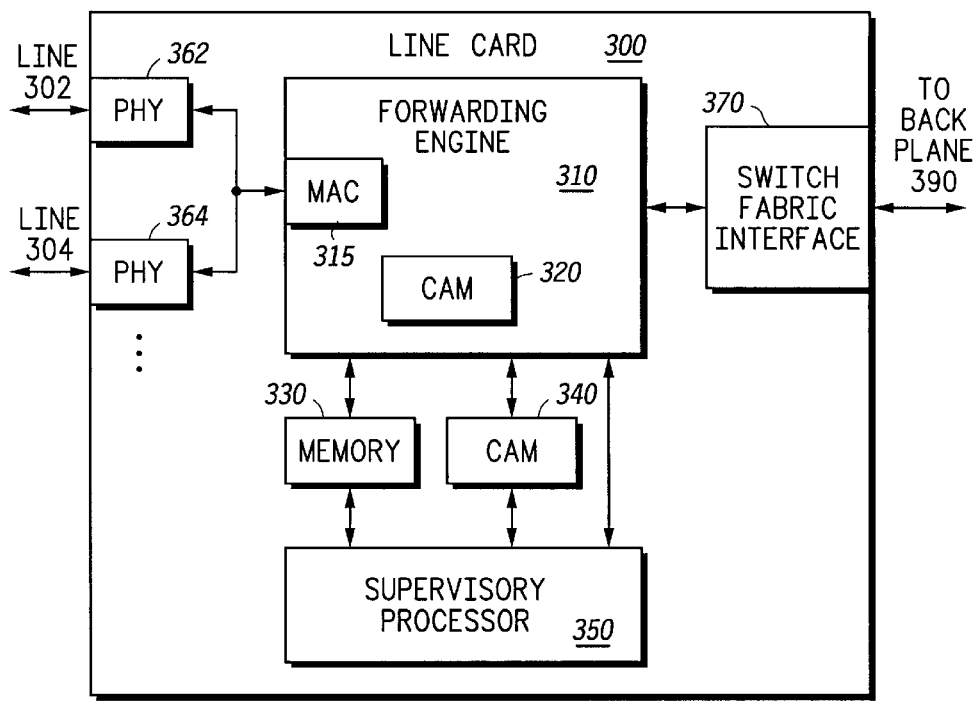

One example of a CAM storing different data types, i.e. IPv4 addresses and MAC addresses, is illustrated in FIG. 6. Those entries that correspond to IPv4 addresses have their corresponding DT2 bits set to 1, while those corresponding to MAC address have their corresponding DT1 bits set to 1. Furthermore, if a MAC entry corresponds to the lower order 32 bits, then its corresponding DT0 bit is set to 1, and if the MAC entry corresponds to the higher order 16 bits, then its corresponding DT0 bit is cleared. The following instructions may be executed to perform a search for IPv4 addresses:

ldentry 0b0100, Rt, Ra branchonclear hit, no_ip_match

In the above segment, the ldentry instruction performs a search on only those entries whose DT2 bit is set to 1, as indicated by $CF_{imm}$ being set to "0100," meaning only DT2 is considered in performing the search. On the other hand, the following instructions may be executed to perform a search for MAC addresses:

ldentry 0b0011, Rt, Ra ldentry 0b1010, Rt, Rb branchonclear hit, no_match

In the above segment, Ra contains the address of the low order 32 bits of the destination MAC address, and Rb contains the address of the remaining 16 bits. The first ldentry performs a search on only those low order 32 bits of MAC addresses, having DT1 and DT0 each set to 1, as indicated by $CF_{imm}$ being set to "0011." If a match is found, the S bit of the entry following the matching entry is set to 1. The second ldentry performs a search on only those entries with the S bit set to 1 and having the DT1 bit set to 1, too, so that only MAC addresses with their S bit set are searched. Therefore, any match found at this point indicates a matching MAC address was found in the CAM.

Instructions to set and clear data type bits 16 may also be defined. Also, hit signal 34 and the data ID bits 17 may be used for conditional branches and jumps and other change of flow instructions. The following instruction provides an example:

branch<Imm_cond_2>, <Imm_offset_16>where the 2 bit Imm_con_2 identifies one of the four bits (one hit bit and 3 data ID bits 17) to use, and the Imm_offset_16 specifies the branch target offset from the current program counter.

It should be apparent to one of ordinary skill in the art that the instructions available to perform CAM operations will vary depending on the available architecture. For example, the instructions and/or operations available may depend on the Instruction Set Architecture (ISA) defined for the microprocessor. Also, any number of condition bits or data type bits may be used, and each condition bit or data type bit may be used in various different ways, and not limited to the uses illustrated by the above examples. Furthermore, other instructions may be designed to access a CAM other than the instructions used throughout the above examples. Other instructions may include: an instruction to store the contents of a register into the tag and mask fields; an instruction to find the address of a free entry having a given size; an instruction to invalidate the entire CAM; and instructions to set and clear condition bits. Any of the above exemplary operations can be implemented either as instructions executing in the data path of a processor or through an interface logic core surrounding CAM 10 if CAM 10 is used as a stand-alone device.

As mentioned above, the operations may be processor instructions defined in an Instruction Set Architecture (ISA) of a microprocessor. Therefore, the ISA may be expanded to include a variety of different CAM instructions that increase the flexibility and versatility of a CAM functional unit. Alternatively, rather than expanding the ISA, existing instructions may be modified to provide the necessary operands to the CAM. For example, an access to a predefined range of memory may automatically route the operands obtained from the memory to the CAM for performing a search. In this manner, a specific instruction would not be necessary to perform a CAM operation.

FIG. 7 illustrates a line card 300 that contains one or more CAM circuits as set forth in FIG. 2. The line card 300 is coupled to analog and/or digital communication lines 302 and 304. Generally, these input/output (I/O) lines 302 and 304 will provide incoming and/or outgoing voice and/or data information in one or more different formats (e.g., ATM, ADSL, ISDN, etc.). This information is received and/or transmitted through use of a circuit referred to as physical (PHY) layers 362 and 364. The PHY layers 362 and 364 interface with the physical lines 302 and 304 via various filters, A/D and D/A converters, DSP processors, and/or like circuitry so that information can be sent to and from the line card 300 in an efficient manner. Information to or from the lines 302 and 304 is communicated between the PHY layers 362 and 364 and a media access controller 315 illustrated in FIG. 7. The media access controller (MAC) 315 may be a separate integrated circuit chip or may be a circuit integrated within the forwarding engine 310. The MAC 315 may also be integrated with the engine 310 as a separate block located on the same contiguous silicon die as the engine 310.

Forwarding engine 310 is generally some execution unit that is used to route or forward information within the line card 300. In one embodiment, forwarding engine 310 is one or more applications specific integrated circuits (ASIC) programmed to perform routing functions. In yet another embodiment the forwarding engine 310 can be a commercially available network processor such as a PowerPC™ microprocessor, another CPU, a digital signal processor (DSP), a microcontroller (MCU), a plurality of these devices, or a like processing engine. This microprocessor or collection of ASICs 310 may contain an integrated internal CAM 320. This CAM 320 may be a conventional CAM or may be a CAM as set forth in FIG. 2 herein. This CAM 320 may be integrated into the engine 310 as a separate stand alone unit (i.e., a peripheral-type device) or the CAM 320 may be integrated as a functional unit into the engine 310 as illustrated subsequently in FIG. 8.

The forwarding engine 310 communicates information to and from the lines 302 and 304 via a switch fabric interface 370. The switch fabric interface 370 allows outgoing and incoming information through the line card 300 to be routed to one or more other line cards or destinations via a back plane 390. By using the circuitry connected between back plane 390 and the lines 302 and 304, significant quantities of voice and/or telecommunication data may be rapidly transmitted between line cards or routers within a larger network. Generally a line card or router will allow multiple pairs or groups of individuals to communicate with one another parallel in time.

The forwarding engine 310 is coupled to memory 330 which may consist of internal or embedded memory located on the forwarding engine 310 and/or external memory comprised of SRAM, DRAM, non-volatile, or like semiconductor memory. In addition to the memory 330, the forwarding engine 310 may interface with an external CAM 340 as illustrated in FIG. 7. The external CAM 340 is preferably similar to that illustrated in FIG. 2, but may be any other CAM having a different architecture than that shown in FIG. 2. A supervisory processor 350 interfaces to the forwarding engine 310, the memory 330, and/or the CAM 340 in order to provide supervisory control within the line card 300. Generally, the processor 350 is used to control the operation of the line card 300, including the updating of routing tables within the CAMs of FIG. 7. In addition, the processor 350 may be used to control the processing of special packets or data which may be provided through the connection between lines 302 and 304 and the back plane 390. In summary, FIG. 7 illustrates how one or more CAMs from FIG. 2 may be used within a line card in a telecommunication system.

FIG. 8 illustrates a forwarding engine 310 that may be used in accordance with the system set forth in FIG. 7. The system 310 of FIG. 8 contains a source bus 412 and a source bus 414. The two sources buses 41 2 and 414 collectively provide one or more operands or pieces of CPU, information to one or more functional units illustrated in FIG. 8. It is important to note that some architectures may use only a single source bus whereas other architectures may use more than two source buses, where such embodiments are also contemplated for use with FIG. 8. Also, other buses may be routed between the functional units of FIG. 8, such as control buses or special data-forwarding buses. In FIG. 8, the one or more source buses 412 and 414 provide information to or from multiple functional units connected generally in parallel to each other.

A first functional unit illustrated in FIG. 8 is a register file 420. Register file 420 will contain global registers, local registers, register control logic, and/or dedicated registers such as a condition code register (CCR) for use within the processor 310. FIG. 8 also expressly illustrates a load store unit 440 that will control the caching and provision of various data and/or instructions within the processor 310. FIG. 8 illustrates at least one arithmetic logic unit (ALU) 460 which represents one or more integer units one or more floating point units, and/or one or more other arithmetic logic units. Additional ALUs is may be a multiply-accumulator, a barrel shifter an algebraic function processor, or other ALU that may be used within modern processors. In parallel with the functional units 420, 440, and 460, is coupled a CAM 430. The CAM 430 is preferably very similar to or identical to the CAM illustrated in FIG. 2. Due to the addition of the CAM 430 as a functional unit within a processor 310, CPU computer instructions may be executed directly by the CAM 430 in a superscaler parallel fashion while other functional units are pipeline processing other data. The provision of a CAM 430 as a functional unit in parallel with other functional units in an architecture provides additional instruction capability and application which may be otherwise available to a processor 310. The addition of a CAM functional unit should speed and/or enhance the application of processor 310 in various telecom environments as discussed herein. Furthermore, alternate embodiments may include any number of CAM functional units that may be coupled to operate substantially in parallel with each other.

In addition to the provision of a CAM 430, FIG. 8 illustrates a branch unit 470 that is used to perform branch prediction and branch processing within the processor 310. In addition, a sequencer 480 is provided in order to determine what operands and/or instructions are to be provided per the source bus 412 and/or source bus 414 to the functional units. In summary, FIG. 8 illustrates a system processor architecture that contains one or more CAMs connected as a functional units within the processor architecture 310.

Figure 9:
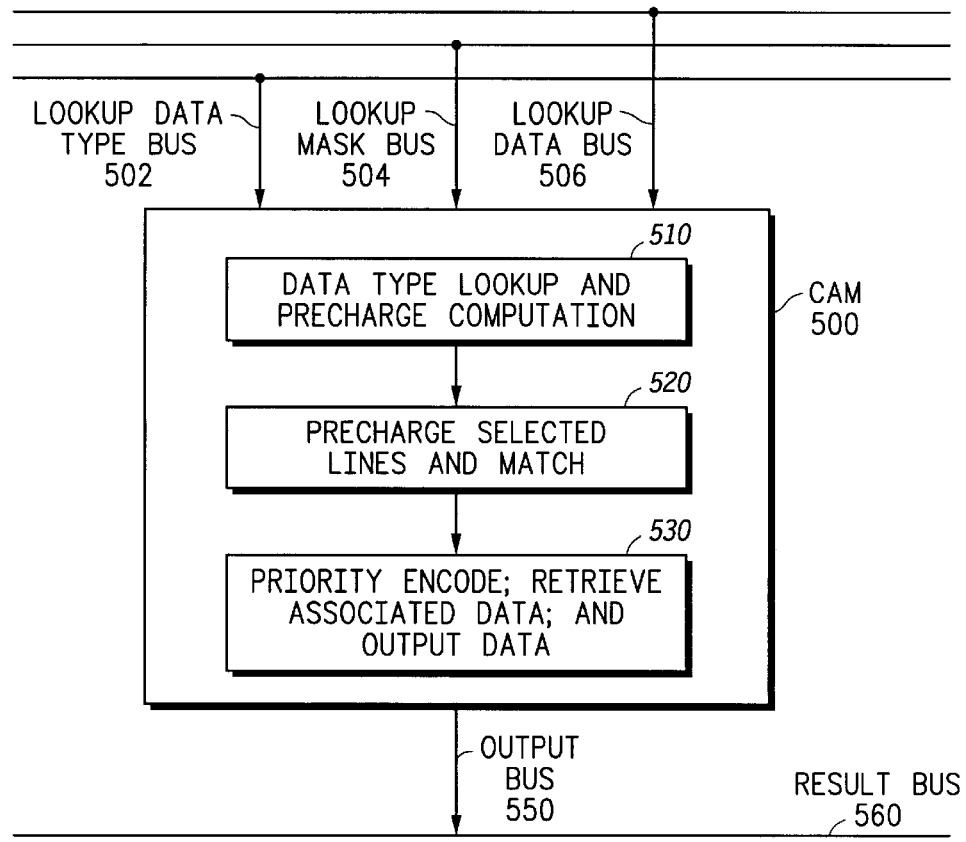
FIG. 9 illustrates a method through which the CAM of FIG. 2 may operate in a pipelined manner.

It is worthwhile to note that the CAM 430 of FIG. 8 may be pipelined in order to improve its throughput when operating in conjunction with a high-frequency microprocessor architecture. FIG. 9 illustrates one example of a CAM pipeline configuration that has three stages. It is important to note that a pipelined architecture that is used in conjunction with the CAM 430 may be more or less than three stages whereby different pipeline architectures other than that specifically set forth in FIG. 9 are contemplated. FIG. 9 specifically illustrates a pipelined CAM 500 that may be used as the CAM 430 in FIG. 8 and the CAM illustrated in FIG. 2. In a first stage of the pipeline, CAM 500 will perform data type lookup and pre-charge computations as illustrated via a first pipeline step 510 of FIG. 9. Therefore, in the step 510 of FIG. 9, the data type bits 72 and 74 as well as the pre-charged circuitry 82 and 84 of FIG. 2 are processed per a first clock of the pipeline process to determine which lines are to be precharged in a next clock cycle. Generally, instep 510, a tri-state buffer, D-flop-flop, or like gating circuit may be located at the output of each of the pre-charged circuits 82 and 84 to prevent or delay the charging of the match lines until the step 520 of FIG. 9 is entered if such charging results in data conflicts.

After performing the data type lookup and pre-charge computations of step 510, step 520 will begin. Step 520 involves pre-charging the selected lines and performing the match operations using the circuits 40 and 50 illustrated in FIG. 2. Latches or storage elements within the priority encoder 90 will prevent such information from contaminating the priority encode operations until entrance of the step 530 in FIG. 9. Therefore, a second clock in the pre-charge sequence will perform the pre-charge operations and the match comparisons via a step 520 in FIG. 9. At this time, another CAM instruction may be entering the CAM via step 510.

After performance of step 520, a step 530 is used to priority encode, retrieve associated data, and output data from the CAM circuit of FIG. 2. Once step 530 is started, the step 520 may begin for a following CAM instruction in the pipeline. Therefore, the three-stage pipeline process of FIG. 9 is performed sequentially through the hardware-stages A, B and C as such are illustrated in FIG. 2. Alternatively, an additional pipeline stage may be added to retrieve the associated data. The use of a pipelined CAM architecture placed as a functional unit within a processor 310 as shown in FIG. 8, will enable for the creation of powerful network processors or DSPs which may be put to new uses in modern telecommunication systems.

Although the invention has been described and illustrated with reference to specific embodiments, it is not intended that the invention be limited to those illustrative embodiments. Those skilled in the art will recognize that modifications and variations ma) be made without departing from the spirit and scope of the invention. Therefore, it is intended that this invention encompass all of the variations and modifications as fall within the scope of the appended claims.

What is claimed is:

1. A microprocessor comprising:
   a plurality of functional units including a content addressable memory (CAM) functional unit, wherein the CAM functional unit comprises a CAM, the CAM comprising a plurality of rows of data, each row comprising:
      an entry data field coupled to store entry data; and
      a data type field which identifies a type of data stored within the entry data field, wherein the data type field does not include a validity indicator, and wherein the data type field indicates whether the entry data has a bit length greater than a bit length of a physical entry in the CAM functional unit; and
   an instruction unit coupled to the plurality of functional units for controlling flow of microprocessor instructions to the functional units; wherein
   the CAM functional unit, responsive to the microprocessor becoming operational, is accessible via at least a portion of the microprocessor instructions under control of the instruction unit.

2. The microprocessor of claim 1 wherein the data type field indicates a type of communication protocol.

3. The microprocessor of claim 1 wherein the data type field comprises:
   a first field coupled to identify the type of communication protocol; and
   a second field coupled to identify whether a plurality of entry data fields corresponding to a plurality of physical entries store information corresponding to a logical entry, the logical entry including information stored across several rows within the CAM functional unit.

4. The microprocessor of claim 1, wherein the CAM comprises a plurality of physical data entries, and the data type field includes a state field which indicates whether a data type of a corresponding entry data field has a length larger than a length corresponding to the plurality of physical data entries.

5. The microprocessor of claim 1 wherein
   the microprocessor is coupled within a data routing system; and
   the data type field of a selected row of data is coupled to indicate an originating entity that is associated with data to be routed in accordance with the data bits of the selected row of data.

6. The microprocessor of claim 1 wherein the CAM functional unit includes an input coupled to receive a lookup data type and lookup data bits.

7. The microprocessor of claim 1 wherein
   the CAM functional unit includes a plurality of data entries; and
   the instruction unit is coupled to provide operands to the CAM functional unit via at least one operand bus, the operands referencing lookup data for comparison with the data entries and lookup data type information.

8. The microprocessor of claim 1 wherein
   the CAM functional unit includes a plurality of data entries; and
   the microprocessor operates in accordance with an instruction set architecture responsive to becoming operational, the instruction set architecture including the microprocessor instructions, the microprocessor instructions including a search instruction for comparing lookup data with the data entries of the CAM functional unit, the search instruction including operands for referencing lookup data for comparison with the data entries and for referencing lookup data type information for identifying a type of the lookup data.

9. A microprocessor comprising:
   a plurality of functional units including a content addressable memory (CAM) functional unit, the CAM functional unit comprising a plurality of rows of data, each row comprising:
      an entry data field coupled to store entry data; and
      a data type field which identifies a type of data stored within the entry data field; and
   an instruction unit coupled to the plurality of functional units for controlling flow of microprocessor instructions to the functional units; wherein
      the CAM functional unit, responsive to the microprocessor becoming operational, is accessible via at least a portion of the microprocessor instructions under control of the instruction unit; and
      wherein the data type field comprises a plurality of bits coupled to identify whether the data bits in the entry data field correspond to a layer of the Intentional Organization for Standardization Reference Model of Open System Interconnection.

10. The microprocessor of claim 9 wherein
    the microprocessor is coupled within a data routing system; and
    the data type field of a selected row of data is coupled to indicate an originating entity that is associated with data to be routed in accordance with the data bits of the selected row of data.

11. The microprocessor of claim 9 wherein the CAM functional unit includes an input coupled to receive a lookup data type and lookup data bits.

12. The microprocessor of claim 11 wherein the lookup data type comprises a plurality of lookup data type bits masked by a lookup data type mask field.

13. The microprocessor of claim 9 wherein the CAM functional unit is a pipelined CAM comprising:
an input pipeline stage for performing a data type lookup and precharge computation responsive to receiving lookup data;
a search pipeline stage for precharging selected lines responsive to completion of the precharge computation and for determining whether data in a data entry matches the received lookup data; and
an output pipeline stage for providing a match indication responsive to the search stage determining whether data in the data entry matches the received lookup data.

14. The microprocessor of claim 13 wherein the CAM functional unit further comprises:
a data retrieval stage for retrieving and outputting data associated with a data entry which matches the received lookup data.

15. The microprocessor of claim 13 wherein the CAM functional unit further comprises:
a priority encoder stage for determining priority among a plurality of data entries which have been determined to match the received lookup data.

16. The microprocessor of claim 9 wherein
the CAM functional unit is a first CAM functional unit; and
the microprocessor further includes a second CAM functional unit which is coupled to operate substantially in parallel with the first CAM functional unit.

17. The microprocessor of claim 9 wherein
the CAM functional unit includes a plurality of data entries; and
the instruction unit is coupled to provide operands to the CAM functional unit via at least one operand bus, the operands referencing lookup data for comparison with the data entries and lookup data type information.

18. The microprocessor of claim 17, wherein
the operands include the lookup data for comparison with the data entries and lookup data type information.

19. The microprocessor of claim 18, wherein
the operands point to lookup data stored in a memory.

20. The microprocessor of claim 19, wherein the operands indicate a register storing the lookup data.

21. The microprocessor of claim 9 wherein
the CAM functional unit includes a plurality of data entries; and
the microprocessor operates in accordance with an instruction set architecture responsive to becoming operational, the instruction set architecture including the microprocessor instructions, the microprocessor instructions including a search instruction for comparing lookup data with the data entries of the CAM functional unit, the search instruction including operands for referencing lookup data for comparison with the data entries and for referencing lookup data type information for identifying a type of the lookup data.

22. The microprocessor of claim 21 wherein the search instruction further includes lookup data type mask information implicit in the lookup data type information.

23. The microprocessor of claim 9 wherein the microprocessor is a network processor coupled within a line card for forwarding information in a router.

24. A method for processing information in a microprocessor including an instruction unit and a CAM functional unit the method comprising:
processing an instruction by the instruction unit;
accessing the CAM functional unit responsive to processing the instruction, wherein the CAM functional unit comprises a CAM;
storing information having a first type in the CAM functional unit, the first type having a first bit length;
storing information having a second type in the CAM functional unit, the second type having a second bit length greater than the first bit length;
providing the CAM functional unit with a data type, wherein the data type input is a plurality of bits that provides a binary value wherein the binary value indicates the type of protocol that is used to transmit data in a data transmission; and
providing output data by the CAM functional unit responsive to being accessed.

25. The method of claim 24 wherein
the instruction is a CAM search instruction for comparing lookup data with data stored in entries of the CAM functional unit; and
the accessing the CAM functional unit includes providing operands for referencing the lookup data and for referencing lookup data type information for identifying a type of the lookup data.

26. The method of claim 24 wherein the accessing the CAM functional unit comprises:
providing lookup data to the CAM functional unit; and
providing lookup data type information to the CAM functional unit.

27. The method of claim 26 wherein the accessing the CAM functional unit further comprises providing lookup data type mask information to the CAM functional unit.

28. The method of claim 24 wherein the accessing the CAM functional unit comprises:
providing lookup data to the CAM functional unit; and
providing lookup data type information to the CAM functional unit, the lookup data type information including an implicit lookup data type mask.

29. The method of claim 24 wherein the providing data by the CAM functional unit comprises providing at least one of the group consisting of the following:
an output hit indication;
an address of a data entry of the CAM functional unit matching lookup data provided by the instruction; and
data associated with the data entry of the CAM functional unit matching lookup data provided by the instruction.

30. The method of claim 24 further comprising:
providing the CAM functional unit with a data type and data;
using the data type and the data to determine if a hit occurs within the CAM functional unit; and
providing output data including a hit indication by the CAM functional unit if the hit occurs.

31. A method for processing information in a microprocessor including an instruction unit and a CAM functional unit, the method comprising
processing an instruction by the instruction unit;
accessing the CAM functional unit responsive to processing the instruction, wherein the CAM functional unit comprises a CAM;

storing information having a first type in the CAM functional unit, the first type corresponding to a first layer of an International Organization for Standardization Reference Model of Open System Interconnection; and storing information having a second type in the CAM functional unit, the second type corresponding to a second layer of an International Organization for Standardization Reference Model of Open System Interconnection; and providing output data by the CAM functional unit responsive to being accessed.

32. The method of claim 31 further comprising:

providing the CAM functional unit with a data type and data;

using the data type and the data to determine if a hit occurs within the CAM functional unit; and providing output data including a hit indication by the CAM functional unit if the hit occurs.

33. The method of claim 31 wherein the instruction is a CAM search instruction for comparing lookup data with data stored in entries of the CAM functional unit; and the accessing the CAM functional unit includes providing operands for referencing the lookup data and for referencing lookup data type information for identifying a type of the lookup data.

34. The method of claim 31 wherein the accessing the CAM functional unit comprises;

providing lookup data to the CAM functional unit; and providing lookup data type information to the CAM functional unit.

35. The method of claim 31 wherein the accessing the CAM functional unit comprises:

providing lookup data to the CAM functional unit; and providing lookup data type information to the CAM functional unit, the lookup data type information including an implicit lookup data type mask.

36. A method for processing information in a microprocessor including an instruction unit and a CAM functional unit, the method comprising:

processing an instruction by the instruction unit;

accessing the CAM functional unit responsive to processing the instruction;

providing output data by the CAM functional unit responsive to being accessed;

storing information having a first type in the CAM functional unit; and storing information having a second type in the CAM function unit, wherein:

the first type corresponds to a hardware interface layer of an International Organization for Standardization Reference Model of Open System Interconnection; and the second type corresponds to a network/transport layer of the International Organization for Standardization Reference Model of Open System Interconnection.

37. A method for processing information in a microprocessor including an instruction unit and a CAM functional unit, the method comprising:

processing an instruction by the instruction unit;

accessing the CAM functional unit responsive to processing the instruction;

providing output data by the CAM functional unit responsive to being accessed;

storing information having a first type in the CAM functional unit, the first type having a first bit length; and storing information having a second type in the CAM function unit, the second type having a second bit length greater than the first bit length, wherein the second bit length is greater than a bit length of a physical entry of the CAM functional unit.

38. A method for processing information in a microprocessor including an instruction unit and a CAM functional unit the method comprising:

processing an instruction by the instruction unit;

accessing the CAM functional unit responsive to processing the instruction;

providing output data by the CAM functional unit responsive to being accessed; wherein the CAM functional unit comprises a plurality of physical data entries, the method further comprising asserting a state bit corresponding to a physical data entry to indicate that a data type of a matching data entry has a length larger than a length corresponding to the plurality of physical data entries.

39. The method of claim 38, further comprising:

processing a second instruction by the instruction unit;

accessing the CAM functional unit responsive to processing the second instruction; and providing output data corresponding to tie second instruction by the CAM functional unit responsive to being accessed, wherein the output data corresponding to the second instruction corresponds to the physical data entry having its state bit asserted.

* * * * *